United States Patent [19]
Schoenfeld

[11] Patent Number: 6,127,245
[45] Date of Patent: *Oct. 3, 2000

[54] GRINDING TECHNIQUE FOR INTEGRATED CIRCUITS

[75] Inventor: Aaron Schoenfeld, Boise, Id.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).

[21] Appl. No.: 08/795,693

[22] Filed: Feb. 4, 1997

[51] Int. Cl.[7] .................... H01L 21/301; H01L 21/46; H01L 21/78
[52] U.S. Cl. .................... 438/460; 438/462; 438/974
[58] Field of Search .................... 438/460, 462, 438/974, FOR 439

[56] References Cited

U.S. PATENT DOCUMENTS

| | | |
|---|---|---|
| 3,839,781 | 10/1974 | Russell . |
| 3,953,919 | 5/1976 | Moore . |
| 5,196,378 | 3/1993 | Bean et al. ............... 437/226 |
| 5,426,073 | 6/1995 | Imaoka et al. . |
| 5,786,632 | 7/1998 | Farnworth et al. ............... 257/701 |
| 5,803,797 | 9/1998 | Piper ............... 451/182 |
| 5,851,137 | 12/1998 | Bhave . |
| 5,899,743 | 6/1995 | Kai et al. . |

FOREIGN PATENT DOCUMENTS

| | | |
|---|---|---|
| 05067599 | 3/1993 | Japan . |
| 5067599 | 3/1993 | Japan . |

OTHER PUBLICATIONS

Sze, S.M. "Semiconductor Devices Physics and Technology," Wiley & Sons, New York, pp. 314–316, 1985.

*Primary Examiner*—John F. Niebling
*Assistant Examiner*—Josetta Jones
*Attorney, Agent, or Firm*—Schwegman, Lundberg, Woessner & Kluth, P.A.

[57] ABSTRACT

An integrated circuit die and method of fabricating the same. The method comprises further grinding, polishing or otherwise treating one or more perimeter edges of an individual circuit die. The perimeter edges are treated to remove a substantial portion of the remaining substrate material layer or scribe therefrom without exposing the active circuitry of the die. The process reduces the overall length and width dimensions of a die producing a smaller circuit die without reducing the amount of circuitry on the die.

16 Claims, 3 Drawing Sheets

6,127,245

GRINDING TECHNIQUE FOR INTEGRATED CIRCUITS

TECHNICAL FIELD OF THE INVENTION

The present invention relates generally to the manufacturing of integrated circuits and in particular the present invention relates to a grinding technique for preparing integrated circuit dies for further assembly process steps.

BACKGROUND OF THE INVENTION

Fabrication of integrated circuit assemblies involves a complicated process including many steps. Depending on the desired product, the steps may vary from manufacturer to manufacturer and vary for different types of circuits. The basic process includes producing an ingot of a substrate material such as silicon having a highly crystalline structure. The ingot is cut into a number of thin wafers which are further ground and polished producing smooth and flat surfaces and smooth edges preferably free from defects such as notches, chips or other surface flaws.

Each wafer is then subjected to a number of intricate process steps to form a plurality of the integrated circuit patterns on one side defining an active circuitry surface. Each wafer is divided or cut into a large number of circuit dies which will eventually be added to integrated circuit assemblies during further process steps. Each die is precisely cut from the wafer to leave a layer of substrate material or scribe on the edges of the dies. Individual dies may be back ground to remove some of the substrate from the inactive surface. The scribe material is left on the edges to protect the active circuitry from damage during further processing steps and to prevent short circuits between the die and another active circuit or lead.

Today's rapidly advancing technology is producing a need for ever smaller and more densely packed circuits and circuitry. The smaller circuits make producing functional and flawless circuits more difficult. There is a continuing need to improve the process to provide a flawless, high quality integrated circuit having more active circuits and to do so in a smaller package.

For the reasons stated above, and for other reasons stated below, which will become apparent to those skilled in the art upon reading and understanding the present specification, there is a need in the art for an improved process of manufacturing integrated circuits which are smaller in size and more reliable than conventionally manufactured components.

SUMMARY OF THE INVENTION

The above-mentioned problems with present wafer manufacturing technology and other problems are addressed by the present invention and which will be understood by reading and studying the following specification. A method of producing an integrated circuit die of improved reliability, durability and dimensional characteristics is described which is useful in the process of fabricating integrated circuit assemblies and the like.

In particular, one method of the invention adds an additional step to the conventional manufacturing process for integrated circuits. A die which has been cut from a wafer is further ground, polished or otherwise treated to remove a portion of the remaining substrate or scribe layer on at least a portion of the edge of the die. Another method of the invention includes further grinding or polishing the entire perimeter edge of a particular die to remove a portion of the remaining scribe layer thereon. Another method of the invention includes the additional step of grinding or polishing a bi-level edge on at least a portion of the perimeter edge of a die. The bi-level edge may be produced in one of two ways. Some of the remaining scribe material may be removed from part of the die's perimeter edge to produce the bi-level edge. Alternatively, the entire edge may be partly ground or polished and then further grinding or polishing a portion of the scribe to produce the bi-level edge. This method creates a bi-level or stepped edge on the die. Such a bi-level edge may be produced on the entire perimeter edge or just a portion of the perimeter edge.

The methods disclosed produce an integrated circuit die which is slightly smaller in length and width than a conventionally produced die. The method further produces a die which is less susceptible to damage such as edge chipping or die cracking. A chip in the edge of a die produces a weak point in its edge which may cause the die to crack during further processing or assembly steps. Such a flaw or chip may also cause a short or otherwise damage the active circuitry of the die.

The invention may be utilized to produce a slightly smaller die having the same circuit capacity as a die which has not undergone the process of the invention. A smaller die may be useful in applications where one previously would have been too large taking up too much space within an integrated circuit assembly. Alternatively, the invention may be used to produce a die having increased circuit capacity with no size increase. In particular, some electronic packages require integrated circuit assemblies of a particular maximum size including the plastic encapsulation material. A die which has had most of the remaining scribe removed from the edges saves length and width permitting a die having more circuit capacity to be used within an application without increasing the size of the assembly.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is to be defined only by the appended claims.

Figure 1:
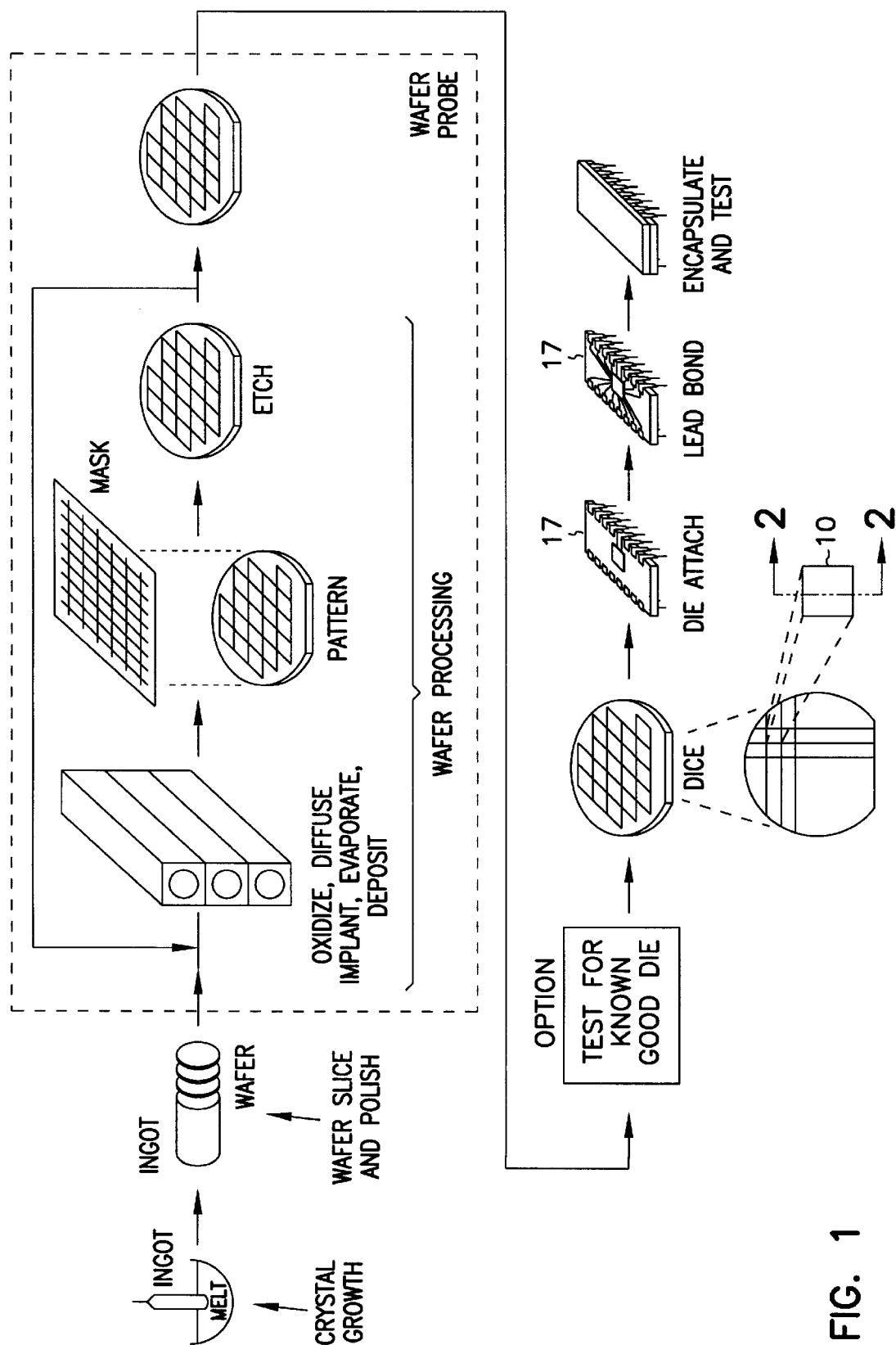
FIG. 1 is a schematic depiction of the typical steps involved in a conventional integrated circuit manufacturing process.

The basic process for fabricating integrated circuits is known in the art and is illustrated in the simple schematic representation of FIG. 1. An ingot of silicon crystal is produced by refining a raw material, such as quartzite, by a complex multi-stage process to produce an electronic grade polysilicon substance. The substance is used to grow single crystal silicon ingots by one of several known processes. The silicon crystal ingot is then sliced into a number of very thin wafers producing the starting substrate for an integrated circuit.

Each wafer is then ground, polished or otherwise treated to produce very smooth, flat substrate surfaces and smooth, flawless edges. One process typically used to finish or treat the wafers is known as chemical mechanical planarization or CMP which is well understood in the art. Each wafer is then individually processed through a number of steps to form the active circuit patterns on one surface of the wafer. These steps may include adding or depositing material on the wafer, masking out a pattern on the wafer, etching a pattern on the wafer and other methods well known in the art. At the time of this writing, for example; a typical wafer may be about 150–200 mm (6–8 in) in diameter and about 0.25–0.50 mm (10–20 mils or 0.01–0.02 in) thick.

The wafers are then evaluated to locate and identify any flawed or damaged circuits. The wafers may then, as an option, be further tested to determine which individual dies are "known good dies" as known to those skilled in the art. Once the active circuitry is formed, the wafer is sawed or diced into a number of integrated circuit dies. The functional dies are then picked off of the wafer and used to produce integrated circuit assemblies. The dies are bonded to a circuit substrate material, leads are attached or formed and connected to the circuitry, and the entire assembly is then further encapsulated in a plastic material to produce a final integrated circuit assembly. The present invention is directed to an improved integrated circuit die and a process for forming the die, the process including the further manufacturing step of grinding, polishing or otherwise treating one or more of the perimeter edges of an individual die. The invention enhances the further integrated circuit process and assembly steps to produce a more durable die of either a smaller size or having a denser circuitry with more circuitry per unit volume of die substrate material.

Figure 2:
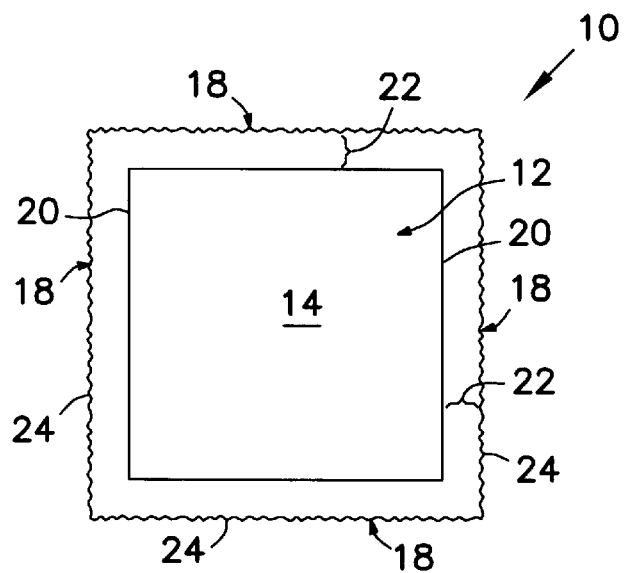
FIG. 2 is a top plan view of an integrated circuit die prior to undergoing the grinding technique of the invention.
Figure 3:
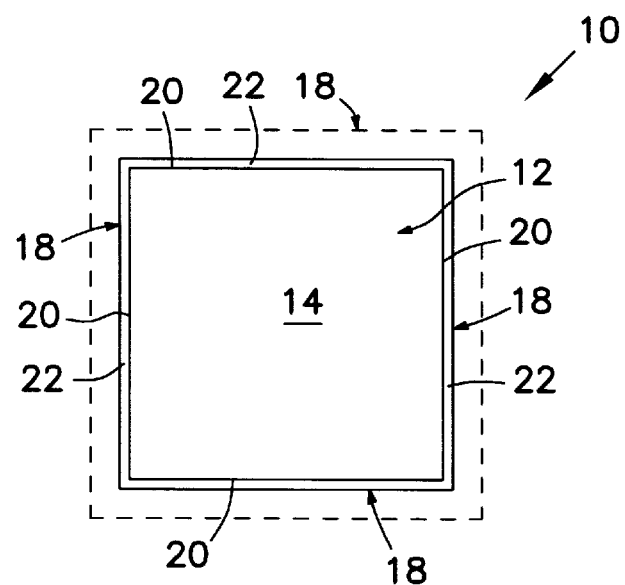
FIG. 3 is a top plan view of the integrated circuit die of FIG. 2 after undergoing the grinding technique of the invention.
Figure 4:
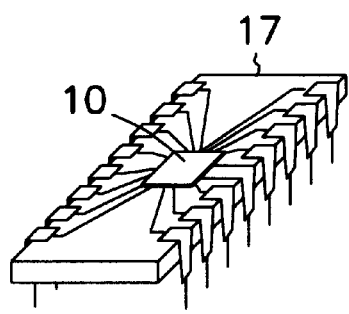
FIG. 4 is an elevated perspective view of an integrated circuit assembly including the die of FIG. 3 prior to encapsulation of the assembly in plastic.
Figure 5:
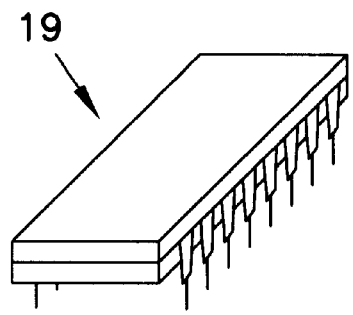
FIG. 5 is an elevated perspective view of the integrated circuit assembly of FIG. 4 after encapsulation.

Referring now to the drawings, FIG. 2 illustrates a top plan view of an integrated circuit die after it has been cut or sawed from a silicon wafer. FIG. 3 illustrates the integrated circuit die after undergoing the additional manufacturing process steps of the invention. As shown in FIG. 2, circuit die 10 includes active circuitry 12 embedded in the silicon material and formed in layers on an active surface 14 of the die. Die 10 further includes a bottom or inactive surface 16 (shown in FIG. 6) opposite the active surface which abuts a surface of a substrate 17 to which the die is bonded in a later process step. FIGS. 4 and 5 illustrate an integrated circuit assembly prior to encapsulation (FIG. 4) and an integrated circuit assembly 19 after encapsulation in plastic (FIG. 5). Die 10 also includes at least one perimeter edge 18 and will likely include four such edges. As illustrated in FIG. 4, a typical integrated circuit die 10 is generally rectangular.

As shown in FIG. 2, the active circuitry 12 of die 10 terminates inboard from each perimeter edge 18 of the die. The circuitry terminates at a last metal interconnect 20 defining the outer active circuitry limits for the die. A layer of remaining scribe material 22 is purposely left protecting the active circuitry 12 on the perimeter edges 18 to prevent open or short circuits and malfunctions within the circuitry and to protect the circuitry from damage during further process and assembly steps. As noted previously, back grinding the die to reduce and flatten the substrate material layer on the inactive surface 16 is known.

As is illustrated in FIG. 2, the unused buffer of silicon or scribe 22 typically has a microscopically rough surface forming a plurality of chips, nicks or other irregularities 24 on the surface and edges of the die. The depth and frequency of these irregularities will depend on many parameters in the formation of the die. Particularly, the sharpness of the blades used to saw each wafer from the ingot of silicon material and to saw each die from a particular wafer has an effect. Other factors which affect the surface quality of the die include the temperature of the blade coolant utilized during the cutting operations and also the speed of the rotating saw blade.

One problem caused by the irregularities 24 on the perimeter edges 18 of the die is that they produce weak points in the silicon or other substrate material. The weak points may ultimately form cracks in the substrate material as the die undergoes further process and assembly steps. A crack in the die may produce unwanted open or short circuits or otherwise damage the active circuitry 12 rendering the die non-functional or defective.

An additional problem with the remaining scribe 22 is that it inherently increases the width and length dimensions of each die 10. Another problem with a conventional integrated circuit die as shown in FIG. 2 is that the perimeter edges 18 do not have an extremely flat finish which is highly desirable in known good die applications. Additionally, some substrate materials used to produce integrated circuits such as gallium arsenide or GaAs are more susceptible to surface flaws and edge damage than other substrate materials.

FIG. 3 illustrates integrated circuit die 10 after undergoing the additional steps of the invention. The layer of remaining scribe 22 as it was prior to reduction is illustrated in phantom view in FIG. 3 (and also in FIG. 6 which is discussed below). The invention involves further removing the layer of remaining scribe 22 on the die and also increasing the smoothness and flatness of the perimeter edges 18 of a die. After separating a wafer into a plurality of dies, each die is further ground or polished by the process of the invention to remove a substantial amount of the remaining scribe 22 and reduce or eliminate any irregularities 24 in the edges 18. Thus, a die which has a smaller length and width and which has much smoother and flatter edges is produced.

As an illustrative example, a die may have a layer of material on each edge which is about 25–50 $\mu$m (1–2 mils) thick. This will increase both the length and the width of a die about 50–100 $\mu$m (2–4 mils). The process of the invention is intended to remove most of this layer of material, leaving only enough material to prevent exposure of the active circuitry of the die. A size reduction of nearly 100 $\mu$m in length and width may be quite significant in some applications.

Reducing or eliminating irregularities 24 eliminates or at least substantially reduces the possibility of cracks forming in the unused substrate material surrounding the die during further process and assembly steps. Thus, the occurrence of cracks and open or short circuits in the active circuitry of the die is also prevented or substantially reduced.

Additionally, removing most of the remaining scribe and reducing the size of the die allows for one of two conditions to be used to significantly improve integrated circuit assemblies. The invention may be utilized to produce a slightly smaller die having the identical circuit density. Typically, very precise design constraints exist for the outer dimensions of integrated circuit assemblies and also for the minimum amount of plastic encapsulating material required to surround an integrated circuit. In some cases, the integrated circuit die size is nearly as large as the size limit of the final package design criteria, leaving little room for the encapsulating plastic material. By removing scribe material via the process of the invention, more encapsulation material may be added without increasing the size of the assembly. Thus, a particular die having the desired circuitry may be utilized in a package where it would have otherwise been too large.

Figure 6:
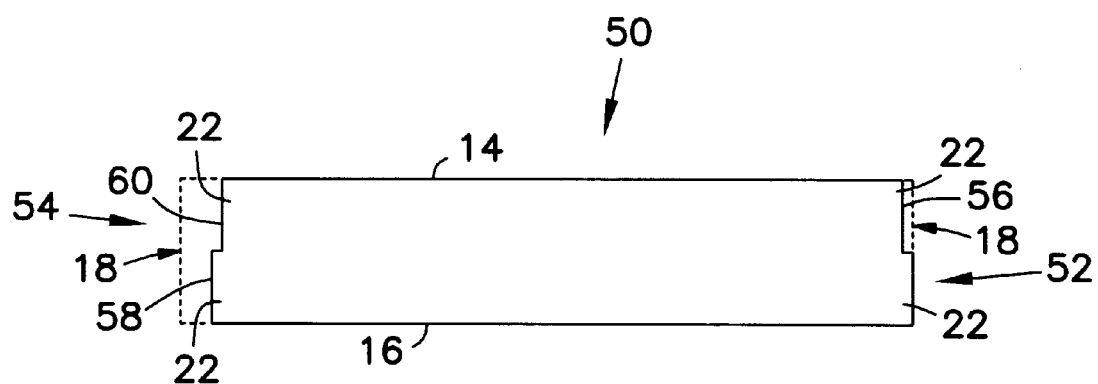
FIG. 6 is a side view of an integrated circuit die having bi-level edges produced using grinding techniques of the invention.

Another embodiment of the present invention is illustrated in FIG. 6. A die 50 is shown having bi-level perimeter edges 52 and 54. The bi-level edge 52 is formed by polishing or grinding down one portion 56 of the side edge to reduce the layer of material of that portion. The remaining portion of edge 52 has been left as initially formed on the die producing the stepped or dual thickness bi-level edge 52. Bi-level edge 54 is produced by grinding or polishing an entire edge to reduce the layer of scribe material to a first level 58 and then further grinding one portion 60 of the edge more than the remaining portion of the same edge. Bi-level edge 54 includes the preferred benefit of having the entirety of each edge subjected to the process of the invention and not just a portion of each edge.

The additional step of grinding or polishing an integrated circuit die 10 according to the invention may be performed using one of several known processes and methods. For illustration purposes, the CMP process will be briefly described. A circuit die may be held by a carrier and forced against a rotary grinding disc or polishing pad. The pad or disc is typically impregnated with a chemical or abrasive slurry which contacts the die edge to remove a portion of the scribe from the edges 18 as the pad or disc rotates. Alternatively, a mechanical gripping device such as a "tweezer" type device may be used to hold the die with an edge 18 adjacent the polishing pad or grinding disc. As will be evident to those skilled in the art, the invention is not to be limited to a particular process of performing the grinding technique of the invention, but only to the steps as described for further removing some of the remaining scribe from the edges and surfaces of an integrated circuit die.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A method of producing an integrated circuit die, said method comprising:

cutting a wafer from an ingot of substrate material;

forming a plurality of active integrated circuit patterns on one side of said wafer;

dividing said wafer into a plurality of individual dies wherein each die includes at least one perimeter edge, an inactive surface, an active surface including at least one of said circuit patterns thereon, and a layer of remaining substrate material on said at least one perimeter edge; and removing a portion of said layer of remaining substrate material from said at least one perimeter edge of one or more of said integrated circuit dies to form a bi-level edge on said at least one perimeter edge.

2. The method of claim 1 wherein removing is performed using the process of chemical mechanical planarization.

3. The method of claim 1 wherein removing is performed by grinding away said portion of said layer of remaining substrate material.

4. The method of claim 1 further including determining which of said dies are known good dies and subsequently subjecting said known good dies to the step of removing a portion of said remaining substrate material therefrom.

5. The method of claim 1 wherein cutting the wafer further comprises cutting from an ingot of gallium arsenide.

6. A method of producing an integrated circuit die, said method comprising:

cutting a wafer from an ingot of substrate material;

forming a plurality of active integrated circuit patterns on one side of said wafer;

determining which of said plurality of active integrated circuit patterns is a known good circuit;

dividing said wafer into a plurality of individual dies wherein each die includes at least one perimeter edge, an inactive surface, an active surface including at least one of said circuit patterns thereon, and a layer of remaining substrate material on said at least one perimeter edge;

selecting from said plurality of individual dies only known good dies having only one or more of said known good circuits thereon;

removing a portion of said layer of remaining substrate material from said at least one perimeter edge of said known good dies; and forming a bi-level step on said at least one perimeter edge.

7. The method of claim 6 wherein removing is performed using the process of chemical mechanical planarization.

8. The method of claim 6 wherein removing is performed by grinding away said portion of said layer of remaining substrate material.

9. The method of claim 6 further determining which of said dies are known good dies and subsequently subjecting said known good dies to the step of removing a portion of said remaining substrate material therefrom.

10. The method of claim 6 wherein cutting the wafer further comprises cutting from an ingot of gallium arsenide.

11. The method of claim 1, further comprising polishing the entire perimeter edge prior to removing the portion of said layer.

12. The method of claim 6, wherein removing the portion includes reducing a length of the one or more integrated circuit dies.

13. The method of claim 6, wherein removing the portion includes removing a layer of about 25–50 $\mu$m from at least one perimeter edge.

14. The method of claim 6, further comprising encapsulating the one or more integrated circuit dies in plastic.

15. The method of claim 6, further comprising polishing an entire surface of at least one perimeter edge prior to forming the bi-level step.

16. The method of claim 6, wherein forming the bi-level step includes forming the bi-level step on an entire surface of the perimeter edge.

* * * * *